(12) United States Patent
Nakagawa

(10) Patent No.: US 6,518,191 B2
(45) Date of Patent: Feb. 11, 2003

(54) METHOD FOR ETCHING ORGANIC FILM, METHOD FOR FABRICATING SEMICONDUCTOR DEVICE AND PATTERN FORMATION METHOD

(75) Inventor: Hideo Nakagawa, Oumihachiman (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/798,913

(22) Filed: Mar. 6, 2001

(65) Prior Publication Data

US 2001/0046780 A1 Nov. 29, 2001

(30) Foreign Application Priority Data

May 26, 2000 (JP) ........................................ 2000-155828

(51) Int. Cl.[7] ........................................... H01L 21/302
(52) U.S. Cl. ........................ 438/710; 438/714; 438/725
(58) Field of Search ............................... 438/706, 710, 438/714, 718, 719, 720, 721, 722, 723, 724, 725

(56) References Cited

U.S. PATENT DOCUMENTS

| | | | | |
|---|---|---|---|---|
| 4,320,191 A | * | 3/1982 | Yoshikawa et al. | ........... 216/67 |
| 5,534,109 A | * | 7/1996 | Fujiwara et al. | ........... 252/79.1 |
| 5,897,377 A | * | 4/1999 | Suzuki | ........... 252/79 |
| 6,080,529 A | * | 6/2000 | Ye et al. | ........... 430/311 |
| 6,194,128 B1 | * | 2/2001 | Tao et al. | ........... 216/41 |

FOREIGN PATENT DOCUMENTS

| | | |
|---|---|---|
| JP | 64-025419 | 1/1989 |
| JP | 01-280316 | 11/1989 |
| JP | 10-150105 | 6/1998 |
| JP | 11-121901 | 4/1999 |
| WO | WO 00/67308 | 11/2000 |

OTHER PUBLICATIONS

M. Fukasawa et al., "Etching Characteristics of Organic Low–k Film", Proceedings of Symposium on Dry Process, VII–3, pp. 175–182, Nov. 1998.
M. Fukasawa et al., "Organic Low–k Film Etching Using N–H Plasma", Proceedings of Symposium on Dry Process, IV–2, pp. 221–226, Nov. 1999.
W. Chen et al., "$SiO_2$ etching in magnetic neutral loop discharge plasma", J. Vac. Sci. Technol. A, vol. 16, No. 3, May/Jun. 1998.

* cited by examiner

Primary Examiner—Robert Kunemund
Assistant Examiner—Kin-Chan Chen
(74) Attorney, Agent, or Firm—Nixon Peabody LLP; Donald R. Studebaker

(57) ABSTRACT

Etching is conducted on an organic film to be used as an interlayer insulating film by using plasma generated from an etching gas containing, as a principal constituent, a compound including carbon, hydrogen and nitrogen, such as methylamine.

8 Claims, 15 Drawing Sheets

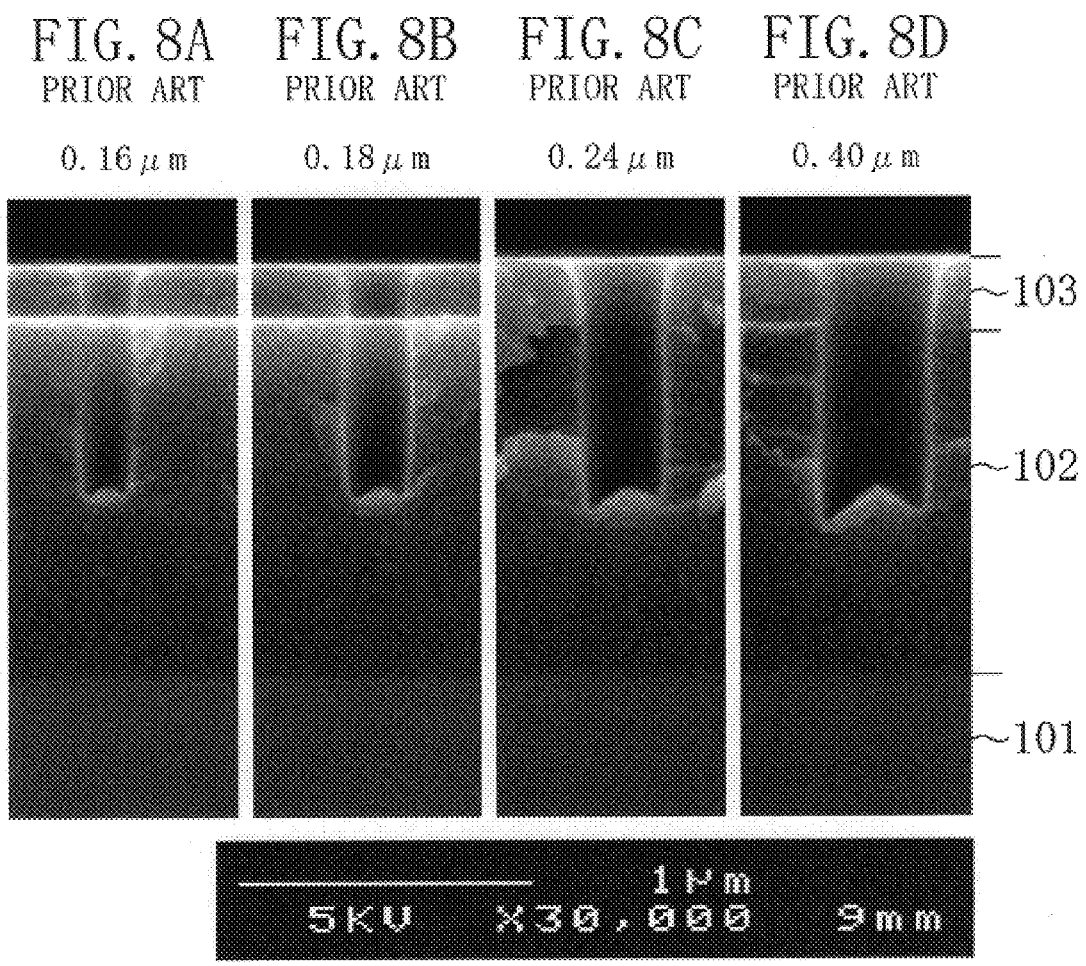

METHOD FOR ETCHING ORGANIC FILM, METHOD FOR FABRICATING SEMICONDUCTOR DEVICE AND PATTERN FORMATION METHOD

BACKGROUND OF THE INVENTION

The present invention relates to a method for etching an organic film, a method for fabricating a semiconductor device and a pattern formation method.

For the purpose of increasing the operation speed and lowering the consumption power of semiconductor devices, decrease of the dielectric constant of an interlayer insulating film included in a multi-level interconnect structure is recently regarded as significant. In particular, an organic film with a small dielectric constant can be easily formed by spin coating and curing, and hence is regarded as a very promising interlayer insulating film of the next generation. A well known example of the organic film with a small dielectric constant is an organic film including an aromatic polymer as a base.

In order to fabricate a device with a refined design rule of a gate length of 0.18 µm or less, a fine interconnect processing technique of approximately 0.25 µm or less is necessary, and the design rule is considered to be more and more refined in the future. An organic film is generally patterned by plasma etching, but a fine pattern of 0.25 µm or less is very difficult to form from an organic film.

Known examples of the plasma etching employed for an organic film are a process using an etching gas including a $N_2$ gas and a $H_2$ gas as principal constituents (reported by M. Fukusawa, T. Hasegawa, S. Hirano and S. Kadomura in "Proc. Symp. Dry Process", p. 175 (1998)) and a process using an etching gas including a $NH_3$ gas as a principal constituent (reported by M. Fukusawa, T. Tatsumi, T. Hasegawa, S. Hirano, K. Miyata and S. Kadomura in "Proc. Symp. Dry Process", p. 221 (1999)).

Conventional Example 1

One of conventional etching methods will now be described as Conventional Example 1 referring to the result obtained by etching an organic film with a magnetic neutral loop discharge (NLD) plasma etching system manufactured by Ulvac Corporation ("$SiO_2$ Etching in magnetic neutral loop discharge plasma", W. Chen, M. Itoh, T. Hayashi and T. Uchida, J. Vac. Sci. Technol., A16 (1998) 1594).

In Conventional Example 1, an organic film is etched by using an etching gas including a $N_2$ gas and a $H_2$ gas as principal constituents. The present inventors have carried out the etching process of Conventional Example 1 under the following conditions:

Plasma etching system: NLD plasma etching system
Volume flow ratio per minute in standard condition of etching gas:

$N_2:H_2=50$ ml:50 ml

Antenna power:
1000 W (13.56 MHz)
Bias power: 200 W (2 MHz)
Pressure: 0.4 Pa
Substrate cooling temperature: 0° C.
Etching time: 180 seconds
FIGS. 8A through 8D are cross-sectional SEM photographs of holes formed under the aforementioned etching conditions in organic films, and the holes of FIGS. 8A through 8D have diameters of 0.16 µm, 0.18 µm, 0.24 µm and 0.40 µm, respectively. In FIGS. 8A through 8D, a reference numeral 101 denotes a silicon substrate, a reference numeral 102 denotes an organic film to be etched, and a reference numeral 103 denotes a mask pattern of a silicon oxide film used as a mask in etching the organic film 102. The organic film 102 has a thickness of approximately 1.02 µm, and the mask pattern 103 has a thickness of approximately 240 nm.

Conventional Example 2

In a multi-level interconnect structure of a semiconductor device, a lower interconnect, an interlayer insulating film and an upper interconnect are successively stacked, and the lower interconnect and the upper interconnect are connected to each other through a pillar-shaped plug formed in the interlayer insulating film. Also, single damascene and dual damascene methods have recently been developed. In the single damascene method, a via hole or an interconnect groove is formed in an interlayer insulating film and is subsequently filled with a metal material, so as to form a connection plug or a metal interconnect. In the dual damascene method, a via hole and an interconnect groove are formed in an interlayer insulating film and are subsequently filled with a metal material, so as to simultaneously form a connection plug and a metal interconnect.

Now, the conventional single damascene method will be described as Conventional Example 2 with reference to FIGS. 9A through 9E and 10A through 10D.

First, as is shown in FIG. 9A, a laminated metal interconnect consisting of a first barrier metal layer 112, a metal film 113 and a second barrier metal layer 114 is formed on a semiconductor substrate 111. Then, as is shown in FIG. 9B, an organic film 115 is formed on the metal interconnect, and thereafter, a silicon oxide film 116 is formed on the organic film 115 as is shown in FIG. 9C.

Then, a resist pattern 117 is formed on the silicon oxide film 116 by a known lithography technique as is shown in FIG. 9D. Thereafter, the silicon oxide film 116 is subjected to plasma etching (dry etching) using the resist pattern 117 as a mask, so as to form a mask pattern 116A from the silicon oxide film 116 as is shown in FIG. 9E.

Next, the organic film 115 is etched by the method for Conventional Example 1 by using the mask pattern 116A, so as to form a recess 118 for a via hole or an interconnect groove in the organic film 115 as is shown in FIG. 10A. Since the resist pattern 117 is formed from an organic compound, it is removed during the etching of the organic film 115.

Subsequently, a third barrier metal layer 119 of TiN or TaN with a small thickness is formed on the wall of the recess 118 by sputtering as is shown in FIG. 10B.

Then, the recess 118 is filled with a metal material film 122 by chemical vapor deposition (CVD) or plating as is shown in FIG. 10C, and a portion of the metal material film 122 formed outside the recess 118 is removed by chemical mechanical polishing (CMP). Thus, a connection plug or metal interconnect 123 is formed as is shown in FIG. 10D.

Conventional Example 3

The conventional dual damascene method will now be described as Conventional Example 3 with reference to FIGS. 11A through 11D, 12A through 12C and 13A through 13C.

First, as is shown in FIG. 11A, a lower laminated metal interconnect consisting of a first barrier metal layer 132, a metal film 133 and a second-barrier metal layer 134 is formed on a semiconductor substrate 131. Then, a first organic film 135 is formed on the lower metal interconnect as is shown in FIG. 11B, and a first silicon oxide film 136 is formed on the first organic film 135 as is shown in FIG. 11C.

Next, a first resist pattern 137 having an opening for a via hole is formed on the first silicon oxide film 136 by a known lithography technique as is shown in FIG. 11D. Then, the first silicon oxide film 136 is subjected to plasma etching (dry etching) by using the first resist pattern 137 as a mask, so as to form a first mask pattern 136A from the first silicon oxide film 136 and remove the first resist pattern 137 as is shown in FIG. 12A. Thereafter, a top face of the first mask pattern 136A is cleaned so as not to damage the first organic film 135.

Then, as is shown in FIG. 123, a second organic film 138 is formed on the first mask pattern 136A, and a second silicon oxide film 139 is formed on the second organic film 138.

Next, as is shown in FIG. 12C, a second resist pattern 140 with an opening for an interconnect groove is formed on the second silicon oxide film 139. Thereafter, the second silicon oxide film 139 is etched by using the second resist pattern 140 as a mask, so as to form a second mask pattern 139A from the second silicon oxide film 139 as is:shown in FIG. 13A.

Subsequently, the second organic film 138 and the first organic film 135 are etched by the method for Conventional Example 1, so as to form an interconnect groove 141 by transferring the second mask pattern 139A onto the second organic film 138 and form a via hole 142 by transferring the first mask pattern 136A onto the first organic film 135 as is shown in FIG. 13B. FIG. 13B shows a state where the via hole 142 is being formed in the first organic film 135, and as shown in this drawing, a deposition including a reaction product generated through the reaction between the etching gas and the first organic film 135 and silicon released from the first mask pattern 136A is adhered onto the wall of the via hole 142, resulting in forming a barrier wall 143 from the deposition.

Next, the second organic film 138 and the first organic film 135 are continuously etched by the method for Conventional Example 1, so as to completely form the via hole 142 in the first organic film 135 as is shown in FIG. 13C. Thereafter, the second barrier metal layer 134 is over-etched so as to completely remove the first organic film 135 remaining on the second barrier metal layer 134. The second resist pattern 140 is completely removed through the etching and the over-etching.

Then, although not shown in the drawings, a third barrier metal layer with a small thickness is formed on the walls of the interconnect groove 141 and the via hole 142 in the same manner as in Conventional Example 2, and the interconnect groove 141 and the via hole 142 are filled with a metal material film. Thereafter, a portion of the metal material film formed outside the connection groove 141 is removed by the CMP. Thus, a connection plug and an upper metal interconnect are formed.

Conventional Example 4

As methods of forming a mask pattern through dry development (plasma etching) of an organic film, a top surface imaging (TSI) process, a three-layer resist process and the like are known.

In the top surface imaging process, a surface of an organic film resulting from pattern exposure is subjected to silylation, so as to selectively form a silylated layer on an exposed or unexposed portion of the organic film. Then, the organic film is subjected to dry development (plasma etching) using the silylated layer as a mask, so as to form a resist pattern.

Now, a pattern formation method using dry development (top surface imaging process) will be described as Conventional Example 4 with reference to FIGS. 14A through 14D.

First, as is shown in FIG. 14A, an organic film 152 is formed on a semiconductor substrate 151, and then a silylation target layer 153 is formed on the organic film 152.

Next, as is shown in FIG. 14B, the silylation target layer 153 is irradiated with exposing light 154 through a photomask 155 for selectively allowing the light to pass, so as to selectively form a decomposed layer 156 in the silylation target layer 153.

Then, as is shown in FIG. 14C, with the substrate temperature increased, a gaseous silylation reagent 157 is supplied onto the silylation target layer 153, so as to selectively silylate a non-decomposed portion (a portion excluding the decomposed layer 156) of the silylation target layer 153. Thus, a silylated layer 158 is formed. Instead of silylating the non-decomposed portion, the decomposed layer 156 may be silylated to form the silylated layer 158.

Next, the organic film 152 is etched by the method for Conventional Example 1 by using the silylated layer 158 as a mask, so as to form an organic film pattern (mask pattern) 152A from the organic film 152 as is shown in FIG. 14D.

Conventional Example 5

Another pattern formation method using dry development (three-layer resist process) will now be described as Conventional Example 5.

First, an organic film and a silicon oxide film are successively formed on a semiconductor substrate, and a thin resist pattern is then formed on the silicon oxide film.

Then, the silicon oxide film is subjected to plasma etching by using the resist pattern as a mask, so as to form a mask pattern by transferring the resist pattern onto the silicon oxide film. Thereafter, the organic film is subjected to dry development by using the mask pattern, so as to form a fine organic film pattern with a high aspect ratio from the organic film.

Next, by using a two-layer mask pattern consisting of the mask pattern and the organic film pattern, an etch target film formed on the semiconductor substrate is etched. In this manner, a fine pattern that cannot be resolved by using a single layer resist can be formed in the etch target film.

The present inventors have carried out the etching method for an organic film of Conventional Example 5 by using an etching gas including an $O_2$ gas under the following etching conditions:

Plasma etching system: NLD plasma etching system

Flow rate per minute in standard condition of etching gas: $O_2$=90 ml

Antenna power: 1000 W (13.56 MHz)

Bias power: 400 W (2 MHz)

Pressure: 0.133 Pa

Substrate cooling temperature: 0° C.

Etching time: 4 minutes

FIGS. 15A and 15B are cross-sectional SEM photographs of holes formed in organic film patterns by the pattern formation method for Conventional Example 5, and the holes of FIGS. 15A and 15B have diameters of 0.18 μm and 0.4 μm, respectively. In FIGS. 15A and 15B, a reference numeral 171 denotes a silicon substrate, a reference numeral 172 denotes an organic film pattern, and a reference numeral 173 denotes a mask pattern of a silicon oxide film. The resist pattern formed on the mask pattern 173 is eliminated during formation of the organic film pattern by the dry development, and hence, the etch target film deposited on the silicon substrate 171 is etched by using a two-layer mask pattern consisting of the organic film pattern 172 and the mask pattern 173.

Problem of Conventional Example 1

The etch shape (the cross-sectional shape of the hole) is apparently a good anisotropic shape (vertical shape) as is shown in FIGS. 8A through 8D.

It is, however, understood through detailed observation of FIGS. 8A through 8D that the hole actually has a bowing cross-section. A bowing cross-section means an arched overhang cross-section. As is obvious from FIGS. 8A through 8D, the hole formed in the organic film 102 through the etching has a larger diameter than the diameter of the opening of the mask pattern 103.

Accordingly, the etching method for Conventional Example 1 has a problem that a hole formed in the organic film 102 cannot have a cross-section tapered toward the bottom (hereinafter referred to as a forward taper cross-section).

Problem of Conventional Example 2

In Conventional Example 2, when the organic film 115 is etched by the method for Conventional Example 1, the recess 118 is formed to have a bowing cross-section as is shown in FIG. 10A.

Since the cross-section of the recess 118 is in the bowing shape, when the third barrier metal layer 119 with a small thickness is formed on the wall of the recess 118, the third barrier metal layer 119 cannot be uniformly formed on the wall of the recess 118 as is shown in FIG. 10B. Specifically, the third barrier metal layer 119 is separated (disconnected) in a portion 120 just below the mask pattern 116A on the wall of the recess 118 and on a bottom 121 of the recess 118.

Accordingly, in forming the connection plug or the metal interconnect 123 by filling the recess 118 with the metal material film 122 by the CVD or plating, the metal material film 122 cannot be uniformly filled. Specifically, since the third barrier metal layer 119 is separated in the portion 120 just below the mask pattern 116A on the wall of the recess 118 and on the bottom 121 of the recess 118, the third barrier layer 119 is electrically insulated, namely, separated. Therefore, for example, when the metal material film 122 of copper is filled by electro-plating, a potential cannot be applied to a portion of the third barrier metal layer 119 inside the recess 118, and hence, the metal material film 122 cannot be uniformly filled in the recess 118. Alternatively, when the recess 118 is filled with the metal material film 122 of tungsten, a tungsten film is abnormally grown in the separated portions of the third barrier metal layer 119, and hence, the metal material film 122 cannot be uniformly filled in the recess 118. Since the metal material film 122 cannot be uniformly filled in the recess 118 in this manner, the connection plug or metal interconnect 123 is defective. As a result, the electric characteristic is disadvantageously degraded so as to degrade the reliability of the semiconductor device.

Problem of Conventional Example 3

In Conventional Example 3, when the second organic film 138 and the first organic film 135 are etched by the method for Conventional Example 1, the interconnect groove 141 and the via hole 142 are formed to have a bowing cross-section as is shown in FIG. 13B.

Furthermore, the deposition including the reaction product and silicon is adhered onto the wall of the via hole 142 as described above. In addition, while the second barrier metal layer 134 is over-etched, the first mask pattern 136A serving as an effective etching mask for forming the via hole 142 is etched through ion sputtering during the etching. Accordingly, the opening of the first mask pattern 136A is enlarged as is shown in FIG. 13C. Therefore, the bowing cross-section of the via hole 142 in the first organic film 135 becomes more serious, and since the wall of the via hole 142 is thus recessed, the barrier wall 143 in a crown shape is formed on the bottom of the via hole 142 from the deposition including the reaction product generated in the etching and silicon.

Accordingly, when the interconnect groove 141 and the via hole 142 are filled with the metal material film by the CVD or plating to form the connection plug and the metal interconnect, the metal material film cannot be uniformly filled, and a connection failure is caused between the connection plug filled in the via hole 142 and the lower metal interconnect. As a result, a multi-level interconnect structure is difficult to form by the dual damascene method.

Problem of Conventional Example 4

In Conventional Example 4, when the organic film 152 is etched by the method for Conventional Example 1, the opening 159 of the organic film pattern 152A is formed to have a bowing cross-section as is shown in FIG. 14D. When the organic film pattern 152A having such a hole with the bowing cross-section is used for etching, it is difficult to conduct highly precise etching.

Problem of Conventional Example 5

In Conventional Example 5, since the organic film is subjected to the dry development carried out by plasma etching using an etching gas including an $O_2$ gas as a principal constituent, the hole formed in the organic film pattern 172 has a larger diameter than the opening of the mask pattern 173 and the hole formed in the organic film pattern 172 has a bowing cross-section as is shown in FIGS. 15A and 15B. When the organic film pattern 172 having such a hole with the bowing cross-section is used for etching the etch target film, it is difficult to conduct highly precise etching.

Therefore, in a method proposed for suppressing the hole of the organic film pattern 172 from having a bowing cross-section, the dry development is carried out on the organic film with the actual substrate temperature kept at a temperature below the freezing point by setting the substrate cooling temperature (refrigerant temperature) to 20° C. through 50° C. below zero.

In order to attain such a low temperature, however, excessive cost and a large-scaled system are required, and hence, there arise problems of increase of the system cost and decrease of the system stability.

Accordingly, it is impossible to form a hole with a forward taper cross-section in an organic film pattern by the method for Conventional Example 5

Needless to say, the problems of Conventional Example 5 (the three-layer resist process) also arise in Conventional Example 4 (the top surface imaging process).

SUMMARY OF THE INVENTION

In consideration o the aforementioned conventional problems, a first object of the invention is forming a recess having a vertical or forward taper cross-section in an organic film by etching the organic film.

A second object of the invention is uniformly forming a barrier metal layer on the wall of a recess by forming the recess to have a vertical or forward taper cross-section in an organic film through plasma etching, so as to uniformly fill the recess with a metal material film.

A third object of the invention is forming an organic film pattern having an opening with a vertical or forward taper cross-section through dry etching (plasma etching) of an organic film, so as to realize precise etching with a large process margin.

In order to achieve the first object, the method for etching an organic film of this invention comprises a step of etching an organic film to be used as an interlayer insulating film by using plasma generated from an etching gas containing, as a principal constituent, a compound including carbon, hydrogen and nitrogen.

In the present method for etching an organic film, the plasma generated from the etching gas includes radicals of $CH_x$ (wherein x =1, 2 or 3) that can easily form a polymer on an etch target surface (the wall and the bottom of a recess), and the polymer of the $CH_x$ radicals adhered onto the wall of the recess formed in the organic film works as a sidewall protection film for inhibiting an ion assisted reaction. Accordingly, the recess can attain a vertical or forward taper cross-section.

In the method for etching an organic film, the compound is preferably methylamine, dimethylamine, trimethylamine, ethylamine or propylamine.

In this manner, the recess formed in the organic film can definitely attain a vertical or forward taper cross-section.

The method for fabricating a semiconductor device of this invention comprises the steps of forming an organic film on a semiconductor substrate; forming a mask pattern, on the organic film, including an inorganic compound as a principal constituent; and forming a recess in the organic film by selectively etching the organic film by using the mask pattern and by using plasma generated from an etching gas containing, as a principal constituent, a compound including carbon, hydrogen and nitrogen.

In the present method for fabricating a semiconductor device, the recess is formed in the organic film by the present method for etching an organic film. Therefore, a recess with a vertical or forward taper cross-section can be formed in the organic film, and the recess is prevented from having a bowing cross-section. Accordingly, a barrier layer can be uniformly formed on the wall of the recess without having a separated portion (disconnected portion), and hence, the recess can be definitely filled with a metal material film. As a result, a connection plug or a buried interconnect with a good electric characteristic can be formed.

In the method for fabricating a semiconductor device, the compound is preferably methylamine, dimethylamine, trimethylamine, ethylamine or propylamine.

In this manner, the recess formed in the organic film can definitely attain a vertical or forward taper cross-section.

In the method for fabricating a semiconductor device, the recess preferably includes a via hole and an interconnect groove formed above the via hole and is filled with a metal material film by a dual damascene method.

In this manner, a barrier layer can be uniformly formed on the walls of a via hole and an interconnect groove without having a separated portion (disconnected portion), and a crown-shaped barrier wall can be prevented from being formed on the bottom of the via hole. Therefore, the via hole and the interconnect groove can be definitely filled with the metal material film. As a result, the electric characteristics of a connection plug filled in the via hole and a metal interconnect filled in the interconnect groove can be improved, and a connection failure between the connection plug and a lower metal interconnect can be avoided. Thus, a multi-level interconnect structure with a good electric characteristic can be formed by the dual damascene method.

The pattern formation method for this invention comprises the steps of forming an organic film on a substrate; forming, on the organic film, a mask layer including an inorganic component; and forming an organic film pattern from the organic film by selectively etching the organic film by using the mask layer and by using plasma generated from an etching gas containing, as a principal constituent, a compound including carbon, hydrogen and nitrogen.

In the present pattern formation method, an opening is formed in the organic film by the present method for etching an organic film. Therefore, an opening with a vertical or forward taper cross-section can be formed in the organic film, and the opening of the organic film pattern can be prevented from having a bowing cross-section. As a result, the etching can be precisely conducted with a large process margin.

In the pattern formation method, the compound is preferably methylamine, dimethylamine, trimethylamine, ethylamine or propylamine.

In this manner, the opening formed in the organic film can definitely attain a vertical or forward taper cross-section.

In the pattern formation method, the mask layer is preferably a silylated layer.

In this manner, an opening with a vertical or forward taper cross-section can be formed in an organic film pattern by a top surface imaging process.

BRIEF DESCRIPTION OF THE DRAWINGS

FIGS. 8A, 8B, 8C and 8D are cross-sectional SEM photographs of holes formed by a conventional method for etching an organic film;

DETAILED DESCRIPTION OF THE INVENTION

Embodiment 1

A method for etching an organic film according to Embodiment 1 of the invention will now be described with reference to FIGS. 1A through 1C, 2A and 2B.

In the method for etching an organic film of this embodiment, a gas including methylamine ($CH_3NH_2$) as a principal constituent is used as the etching gas, so as to etch an organic film with plasma generated from methylamine. Exemplified etching conditions in Embodiment 1 are:

Plasma etching system: NLD plasma etching system
Type of etching gas and flow rate per minute in standard condition:

$CH_3NH_2$=100 ml

Figure 1A:
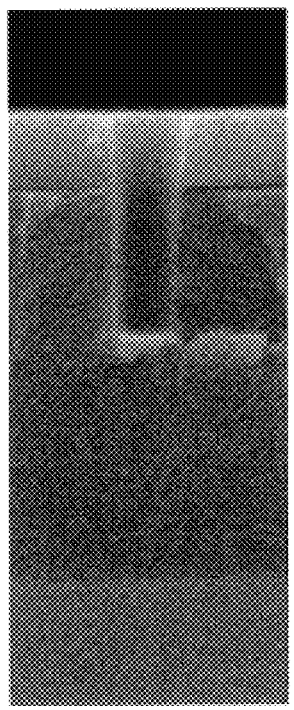
FIGS. 1A, 1B and 1C are cross-sectional SEM photographs of holes formed by a method for etching an organic film according to Embodiment 1 of the invention.
Figure 1B:
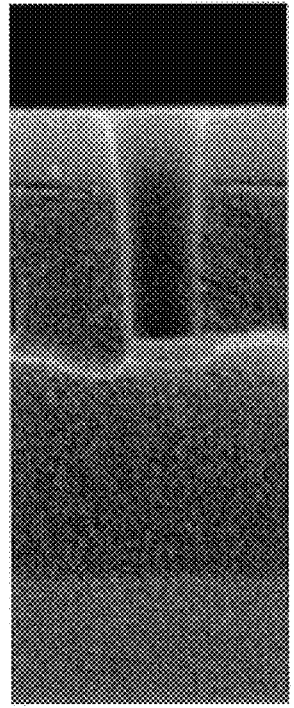
Figure 1C:
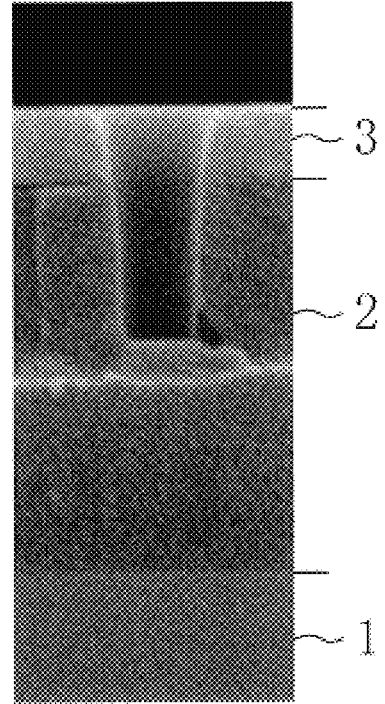

Antenna power: 1000 W (13.56 MHz)
Bias power: 200 W (2 MHz)
Pressure: 0.4 Pa
Substrate cooling temperature: 0° C.
Etching time: 180 seconds FIGS. 1A through 1C are cross-sectional SEM photographs of holes formed by the method for etching an organic film of Embodiment 1, and the holes of FIGS. 1A through 1C have diameters of 0.18 $\mu$m, 0.22 $\mu$m and 0.24 $\mu$m, respectively. In FIGS. 1A through 1C, a reference numeral 1 denotes a silicon substrate, a reference numeral 2 denotes an organic film to be etched, and a reference numeral 3 denotes a mask pattern of a silicon oxide film. At the beginning of the etching, a resist pattern with a thickness of approximately 0.4 $\mu$m is formed on the mask pattern 3, and the resist pattern is eliminated during the etching of the organic film 2.

As is understood from FIGS. 1A through 1C, the hole formed in the organic film 2 has a smaller diameter than the opening of the mask pattern 3, and all the holes formed in the organic film 2 satisfactorily have forward taper cross-sections.

Figure 2A:
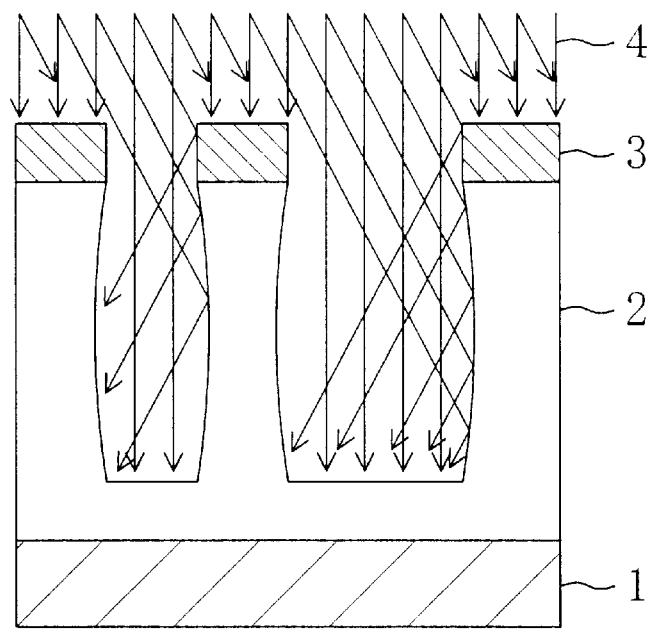
FIG. 2A is a diagram for explaining the mechanism of a conventional method for etching an organic film and FIG. 2B is a diagram for explaining the mechanism of the method for etching an organic film of Embodiment 1.
Figure 2B:
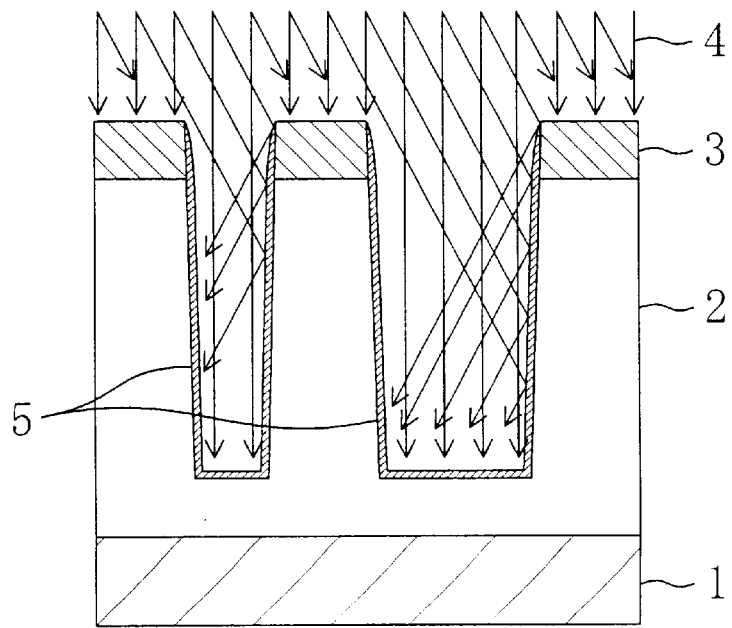

FIGS. 2A and 2B are diagrams for explaining an effect of the etching method for Embodiment 1, wherein FIG. 2A shows the etching mechanism attained by using a conventional etching gas of a mixed gas including $N_2$ and $H_2$ or a $NH_3$ gas and FIG. 2B shows the etching mechanism attained by using the etching gas of $CH_3NH_2$ of Embodiment 1.

In FIGS. 2A and 2B, a reference numeral 1 denotes a silicon substrate, a reference numeral 2 denotes an organic film to be etched, a reference numeral 3 denotes a mask pattern of a silicon oxide film, a reference numeral 4 denotes a radical included in the plasma and a reference numeral 5 denotes a deposition film deposited on the wall and the bottom of a recess formed in the organic film 2 by the etching.

The radicals 4 (hereinafter, reactive neutral particles with activity including atoms are generally designated as the radicals) are electrically neutral particles and hence isotropically reach the silicon substrate 1 from the plasma. On the other hand, ions accelerated in a plasma sheath region to reach the silicon substrate 1 vertically enter the silicon substrate 1.

In general, in conducting anisotropic etching by using plasma, the etching is mainly realized by proceeding an ion assisted etching reaction, and is minimally proceeded by chemical sputtering, physical sputtering and a thermochemical reaction as compared with the ion assisted etching reaction. In the ion assisted reaction, when ions are released from the plasma to reach an etch target film, the ions are accelerated by an electric field of a plasma sheath region formed between a plasma generation region and the etch target film so as to collide with the etch target film, resulting in proceeding a surface chemical reaction in the vicinity of collision portions by collision energy. The mechanism of the etching through the ion assisted reaction is roughly divided into the following two types:

First Etching Mechanism

In the first mechanism, reactive radicals participating in the etching reaction are physically or chemically adsorbed onto the etch target surface, and this mechanism is further classified into the following three cases:

In the first case, ions collide with the vicinity of the portion where the radicals are adsorbed, so as to cause a chemical reaction among the ions, the adsorbed substance and the material of the etch target film.

In the second case, the adsorption is further proceeded so as to form a thin deposition film on the etch target surface, and also in this case, the ion assisted reaction can be efficiently proceeded through the ion collision, so as to attain a high etching rate.

In the third case, the deposition film has a large thickness, and in this case, most of ions reaching the etch target surface are consumed in removing the deposition film, and hence, the etching rate is excessively lowered. Also, when the thickness of the deposition film is larger than a predetermined value, namely, too large to remove through the ion collision, the deposition film cannot be removed by the ions. Therefore, the chemical reaction among the ions reaching the etch target surface, the adsorbed substance and the material of the etch target film is terminated, resulting in stopping the etching.

Second Etching Mechanism

In the second mechanism, no reactive radicals participating in the etching reaction is adsorbed onto the etch target surface. In this case, ions collide with the etch target surface and cause a chemical reaction with the material of the etch target film directly by the energy of the ions themselves, so as to proceed the ion assisted etching reaction.

In the case where the plasma of the mixed gas including $N_2$ and $H_2$, generated radicals are considered to be N, $N_2$, H and $H_2$, and in the case where the plasma of a $NH_3$ gas is used, generated radicals are considered to be not only N, $N_2$, H and $H_2$ but also NH, $NH_2$ and $NH_3$. Therefore, when the $NH_3$ gas is used, the amount of generated radicals is larger as compared with the case where the mixed gas of $N_2$ and $H_2$ is used, and hence, the amount of substances adhered onto the etch target surface seems to be increased. However, the adhered substances cannot resist the collision of the ions emitted from the plasma to the etch target surface, and hence, no deposition is formed on the etch target surface.

Accordingly, the etching reaction occurring on the etch target surface on the bottom of the recess is probably dominantly a reaction to etch a small amount of atoms or molecules adhered onto the etch target surface and atoms present on the surface of the organic film by the ion assisted reaction caused by the ions emitted from the plasma (by the mechanism of the first case of the first etching mechanism), or an etching reaction between the ions and the etch target surface (by the second etching mechanism). In particular, in the etching by using the conventional plasma of $N_2$ and $H_2$, the etching is probably dominantly proceeded by the second etching mechanism.

Since a hydrogen ion is small in its atomic radius and inertial mass, it probably enters the inside of the organic film without causing a reaction when it reaches the etch target surface. Therefore, it seems that nitrogen ions and ions of ammonia fragments (molecules and atoms generated through dissociation and decomposition from ammonia molecules) are the prime cause for proceeding the ion assisted reaction.

In general, an organic film includes, as a principal constituent, a polymer consisting of carbon atoms and hydrogen atoms, and the organic film is etched by nitrogen or hydrogen radicals and ions reaching the organic film as in Conventional Example 1. Therefore, it seems that a principal reaction product generated in the etching is volatile HCN and that the etching is proceeded by releasing the HCN from the etch target surface.

In contrast, when the plasma of the $CH_3NH_2$ gas is used as in Embodiment 1, radicals of N, $N_2$, C, H, CH, $CH_2$, $CH_3$, CN are produced. Specifically, Embodiment 1 is different from Conventional Example 1 in a point that there exist radicals of $CH_x$ (wherein x is 1, 2 or 3). These radicals tend to form a polymer on the etch target surface, and hence, the deposition film 5 is formed on the etch target surface, thereby fixing atoms necessary for the etching reaction onto the etch target surface. The deposition film 5 with an appropriate thickness has a function as a reaction layer, so as to serve as the prime cause for efficiently causing the ion assisted reaction (by the mechanism of the second case of the first etching mechanism).

However, on the wall of a recess where the probability of the ion collision is very small, the deposition film 5 works as sidewall protection film for inhibiting the ion assisted reaction. Therefore, the recess attains a forward taper cross-section.

Furthermore, on the bottom of a recess where a large number of ions collide, the ion assisted reaction is caused between the deposition film 5 formed on the bottom and the colliding ions, so as to efficiently proceed the etching. In other words, the etching is proceeded on the bottom of a recess with the thickness of the organic film 2 reduced accordingly to the thickness of the deposition film 5, resulting in the recess having a vertical or forward taper cross-section.

Accordingly, a recess having a vertical or forward taper cross-section can be formed in an organic film in Embodiment 1.

Although the gas including methylamine as a principal constituent is used as the etching gas in Embodiment 1, any other gas containing, as a principal constituent, a compound including carbon, hydrogen and nitrogen can be widely used instead. The same etching characteristic as that attained by methylamine can be attained by using, for example, one of or a combination of dimethylamine ($(CH_3)_2NH$), trimethylamine ($(CH_3)_3N$) and ethylamine ($C_2H_5NH_2$). Methylamine, dimethylamine, trimethylamine and ethylamine can be very conveniently used because they can be taken out as a gas at a pressure of 1 atm and a temperature of 25° C. (room temperature). The boiling points at a pressure of 1 atm of methylamine, dimethylamine, trimethylamine and ethylamine are −6.3° C., +7.4° C., +2.9° C. and +16.6° C., respectively.

Alternatively, a gas principally including propylamine ($C_3H_7NH_2$) may be used as the etching gas instead of the gas principally including methylamine. Since the boiling point of propylamine is 48.5° C., the temperature should be increased to approximately 50° C. or more in order to take out propylamine as a gas, and hence, propylamine is slightly less convenient. However, the same etching characteristic as that attained by methylamine can be attained when propylamine can be taken out to be supplied to a plasma reaction chamber.

Furthermore, the following gases can also be used to attain the same etching characteristic as that attained by methylamine if they can be taken out as a gas by any of currently practically used techniques (such as a heating technique): A gas of the nitrile family such as acetonitrile ($C_2H_3N$; having a boiling point at 1 atm of 81.8° C.); acrylonitrile ($C_3H_3N$; having a boiling point at 1 atm of 78.5° C.); and propionitrile ($C_3H_5N$; having a boiling point at 1 atm of 97.1° C.); a gas of the diamine family such as 1,2-ethanediamine ($C_2H_8N$; having a boiling point at 1 atm of 117.2° C.); and a gas including four or more carbon atoms such as $C_4H_5N$, $C_4H_7N$, $C_4H_{11}N$, $C_5H_7N$ and $C_5H_9N$ (having a boiling point at 1 atm of approximately 100° C. or more except for $C_4H_{11}N$ having a boiling point at 1 atm of 70° C. or less).

Apart from the aforementioned compounds, an example of the compound that can be easily taken out as a gas and can realize the same etching characteristic as that attained by methylamine is hydrogen cyanide (so-called hydrocyanic acid (HCN)). However, hydrogen cyanide is not preferred because it is virulently poisonous for human bodies.

As described so far, the most practically useful compounds including at least carbon, hydrogen and nitrogen are methylamine, dimethylamine, trimethylamine, ethylamine and propylamine.

Furthermore, a gas to be used in the plasma etching may be optimally selected basically depending upon the method and the system for exciting the plasma. As a plasma etching system can more highly excite the plasma, a higher molecular gas can be used, and hence, a gas to be used can be selected from a larger range. Specifically, when a plasma etching system capable of high excitement, such as an inductively coupled plasma etching system, a surface wave plasma etching system, an NLD plasma etching system, a capacity coupled parallel plate etching system using RF and an ECR plasma etching system, is used, a gas to be used can be selected in accordance with the actually used power (energy).

Also, the effects of this invention are described in Embodiment 1 on the basis of the result obtained by using the etching gas in the NLD plasma etching system. However, the method for etching an organic film of Embodiment 1 is applicable to use of any plasma etching system, such as a parallel plate reactive ion etching system, a narrow-gap or two-frequency type parallel plate reactive ion etching system, magnetron enhanced reactive ion etching system, an inductively coupled plasma etching system, an antenna coupled plasma etching system, an electron cyclotron resonance plasma etching system and a surface wave plasma etching system.

Embodiment 2

A method for fabricating a semiconductor device (single damascene method) according to Embodiment 2 of the invention will now be described with reference to FIGS. 3A through 3D and 4A through 4D.

Figure 3A:
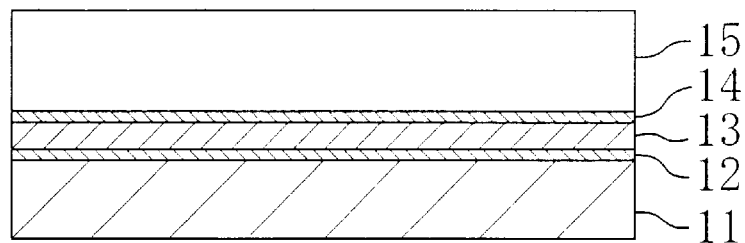
FIGS. 3A, 3B, 3C and 3D are cross-sectional views for showing procedures in a method for fabricating a semiconductor device according to Embodiment 2 of the invention.
Figure 3B:
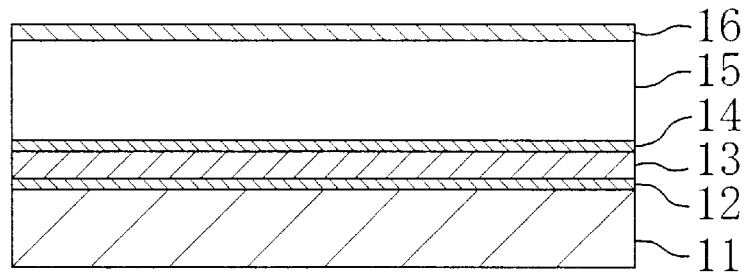

First, as is shown in FIG. 3A, a laminated metal interconnect consisting of a first barrier metal layer 12, a metal film 13 and a second barrier metal layer 14 is formed on a semiconductor substrate 11, and an organic film 15 is formed on the metal interconnect. Thereafter, as is shown in FIG. 3B, a silicon oxide film 16 is formed on the organic film 15.

Figure 3C:
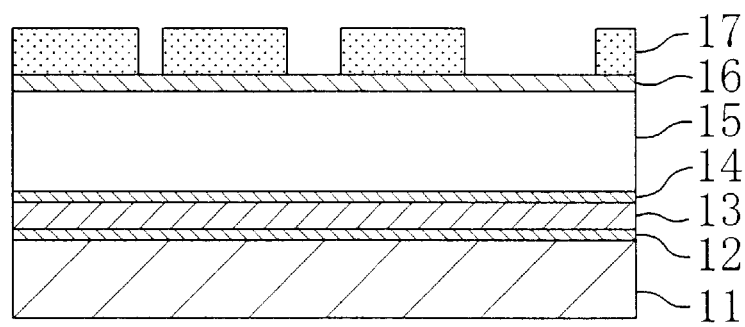
Figure 3D:
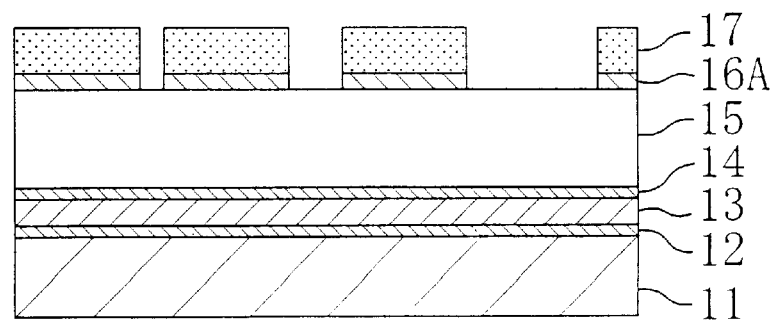

Next, as is shown in FIG. 3C, a resist pattern 17 is formed on the silicon oxide film 16 by a known lithography technique. Thereafter, the silicon oxide film 16 is subjected to plasma etching (dry etching) by using the resist pattern 17 as a mask, thereby forming a mask pattern 16A from the silicon oxide film 16 as is shown in FIG. 3D. The type of etching gas used in the plasma etching is not specified, and for example, a gas including fluorocarbon may be used.

Figure 4A:
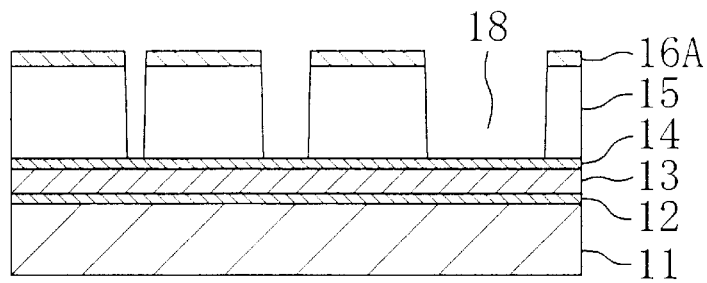
FIGS. 4A, 4B, 4C and 4D are cross-sectional views for showing other procedures in the method for fabricating a semiconductor device of Embodiment 2.

Subsequently, in the same manner as in Embodiment 1, the organic film 15 is etched by using the resist pattern 17 and the mask pattern 16A as masks and by using plasma generated from an etching gas mainly including a gas of a compound including carbon, hydrogen and nitrogen. Thus, a recess 18 having a forward taper cross-section to be used as a via hole or an interconnect groove is formed in the organic film 15 as is shown in FIG. 4A. The conditions for this etching are the same as those employed in the etching method for Embodiment 1. Since the resist pattern 17 is formed from an organic compound, it is removed during the etching of the organic film 15.

Figure 4B:
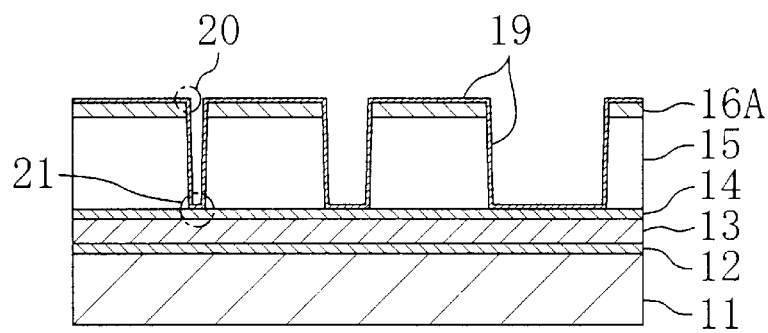

Next, after cleaning the inside of the recess 18 and the top face of the mask pattern 16A, a third barrier metal layer 19 of TiN or TaN with a small thickness is formed on the wall of the recess 18 by sputtering as is shown in FIG. 4B. In this case, the recess 18 has the vertical or forward taper cross-section because it is formed by the etching method according to Embodiment 1. Therefore, the third barrier metal layer 19 can be uniformly continuously formed without having a separated portion (disconnected portion) in a portion 20 in the vicinity of the interface between the mask pattern 16A and the organic film 15 (a portion just below the mask pattern 16A) and on a bottom 21 of the recess 18.

Figure 4C:
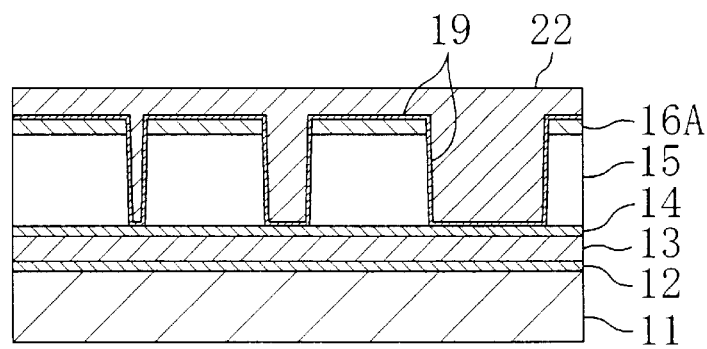
Figure 4D:
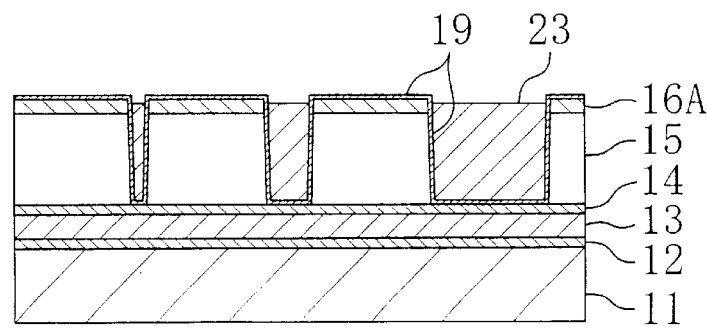

Then, as is shown in FIG. 4C, the recess 18 is filled with a conducting film 22 by chemical vapor deposition or plating, and a portion of the conducting film 22 exposed outside the recess 18 is removed by chemical mechanical polishing. In this manner, a connection plug or metal interconnect 23 is obtained as is shown in FIG. 4D. Thereafter, the aforementioned procedures of Embodiment 2 are repeated so as to alternately form a connection plug and a metal interconnect, resulting in fabricating a multi-level interconnect structure.

Since the recess 18 has a vertical or forward taper cross-section in Embodiment 2, the third barrier metal layer 19 can be uniformly continuously formed. Therefore, the conducting film 22 can be uniformly filled. As a result, the electric characteristic is never degraded, resulting in improving the reliability of the semiconductor device.

In Embodiment 2, the conducting film 22 can be formed from, for example, a polysilicon film, a W film, an AlCu film, a Cu film, an Ag film, an Au film or a Pt film.

Furthermore, the materials for the first barrier metal layer 12 and the second barrier metal layer 14 may be selected so as to accord with the metal film 13, and for example, a multi-level film including a Ti film and a TiN film or a Ta film and a TaN film may be used.

Moreover, an insulating film of a $Si_3N_4$ film or the like may be used as a barrier layer instead of the second barrier metal layer 14. In this case, after the etching of the organic film for forming the recess 18, the $Si_3N_4$ film is additionally etched.

Although the mask pattern 16A of Embodiment 2 is formed from a silicon oxide film, it can be formed from a silicon nitride film instead, whereas the material for the silicon nitride film preferably has a smaller dielectric constant than the silicon oxide film. From this point of view, a material with a small dielectric constant such as a-SiC:H is preferably used.

Also, in the case where the mask pattern 16A is also removed in removing the conducting film 22 by the chemical mechanical polishing, the mask pattern 16A may be formed from a material with a large dielectric constant, such as a conducting film of titanium or the like, a silicon nitride film, or a metal nitride film of titanium nitride or the like.

Embodiment 3

A method for fabricating a semiconductor device according to Embodiment 3 of the invention (dual damascene method) will now be described with reference to FIGS. 5A through 5D and 6A through 6C.

Figure 5A:
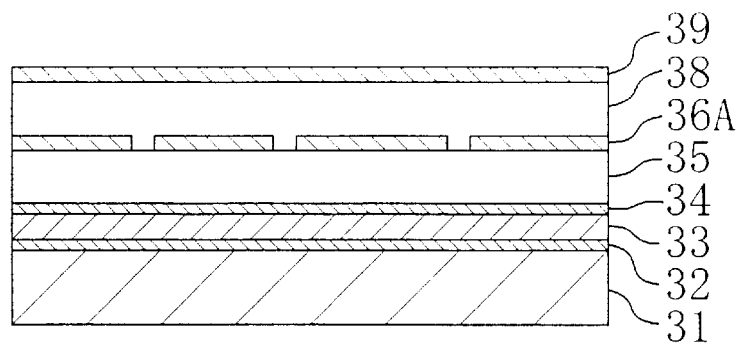
FIGS. 5A, 5B, 5C and 5D are cross-sectional views for showing procedures in a method for fabricating a semiconductor device according to Embodiment 3 of the invention.

First, as is shown in FIG. 5A, a lower laminated interconnect consisting of a first barrier metal layer 32, a conducting film 33 and a second barrier metal layer 34 is formed on a semiconductor substrate 31 in the same manner as in Conventional Example 3. Thereafter, a first organic film 35, a first mask pattern 36A of a first silicon oxide film having an opening for a via hole, a second organic film 38 and a second silicon film 39 are successively formed on the lower interconnect.

Figure 5B:
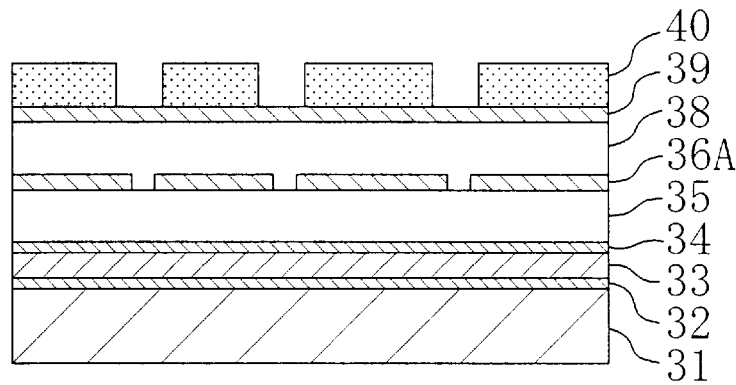
Figure 5C:
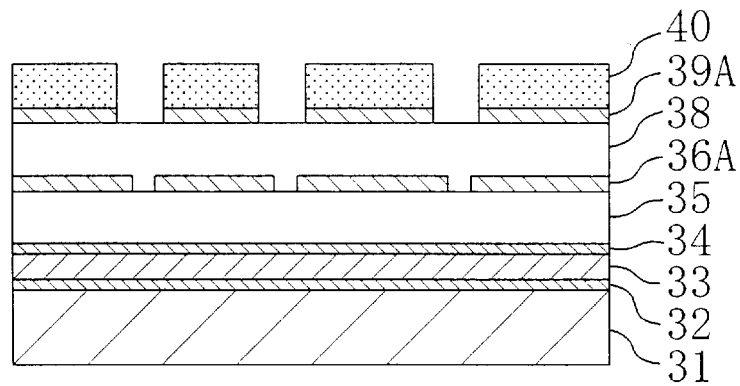

Next, as is shown in FIG. 5B, after a resist pattern 40 having an opening for an interconnect groove is formed on the second silicon oxide film 39, the second silicon oxide film 39 is etched by using the resist pattern 40 as a mask, thereby forming a second mask pattern 39A from the second silicon oxide film 39 as is shown in FIG. 5C.

Figure 5D:
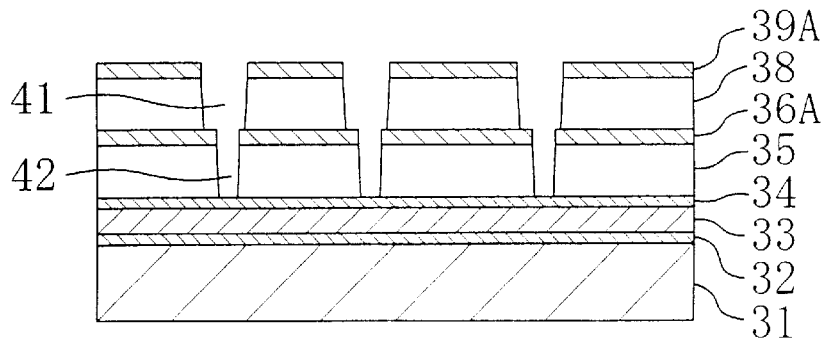

Then, the second organic film 38 and the first organic film 35 are etched by using plasma generated from an etching gas mainly including a gas of a compound including carbon, hydrogen and nitrogen in the same manner as in Embodiment 1. Thus, as is shown in FIG. 5D, an interconnect groove 41 is formed by transferring the second mask pattern 39A onto the second organic film 38 and a via hole 42 is formed by transferring the first mask pattern 36A onto the first organic film 35. The conditions for this etching are the same as those for the etching method according to Embodiment 1.

Since the via hole 42 and the interconnect groove 41 are formed by the etching method for Embodiment 1, each of the via hole 42 and the interconnect groove 41 has a vertical or forward taper cross-section.

During the etching of the first organic film 35, deposition films are formed on the top face of the first mask pattern 36A substantially working as a mask and on the wall of its opening, and during over-etching of the first organic film 35 after forming the via hole 42, deposition films are formed on the wall and the bottom of the via hole 42. Therefore, the opening of the first mask pattern 36A can be prevented from being enlarged by ion sputtering.

Furthermore, a thin deposition film deposited on the second barrier metal layer 34 exposed on the bottom of the via hole 42 prevents the second barrier metal layer 34 from being ion-sputtered.

Figure 13A:
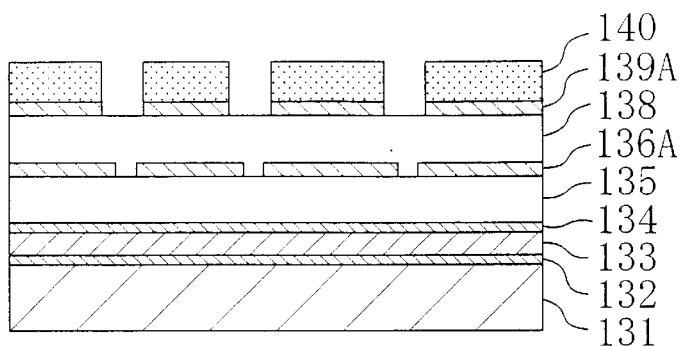
FIGS. 13A, 13B and 13C are cross-sectional views for showing still other procedures in the conventional method for fabricating a semiconductor device (dual damascene method)
Figure 13B:
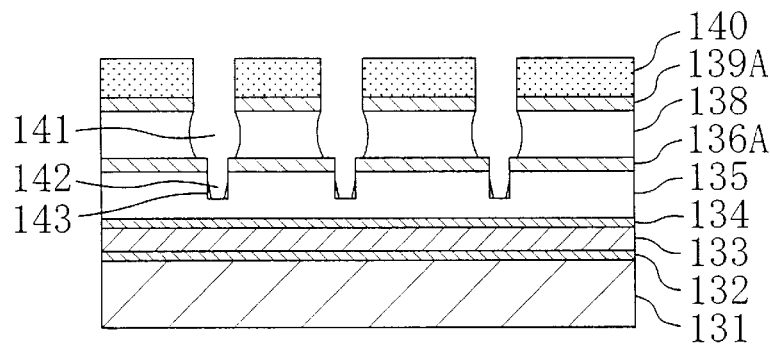
Figure 13C:
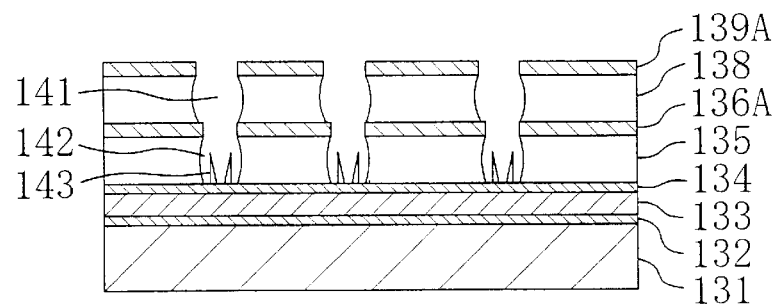
Figure 14A:
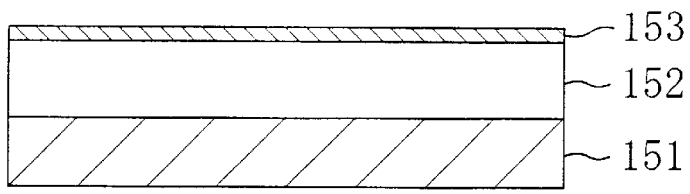
FIGS. 14A, 14B, 14C and 14D are cross-sectional views for showing procedures in a conventional mask pattern formation method (top surface imaging process)
Figure 14B:
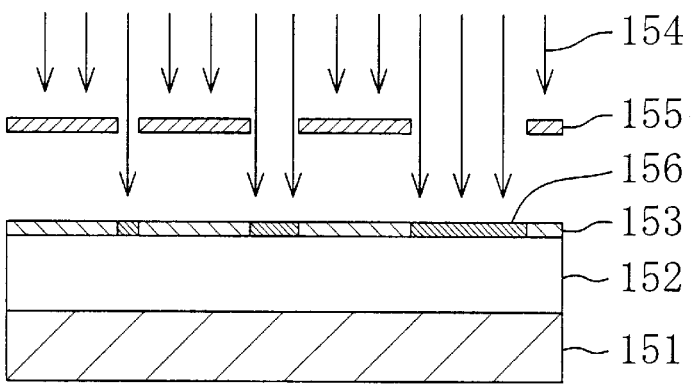
Figure 14C:
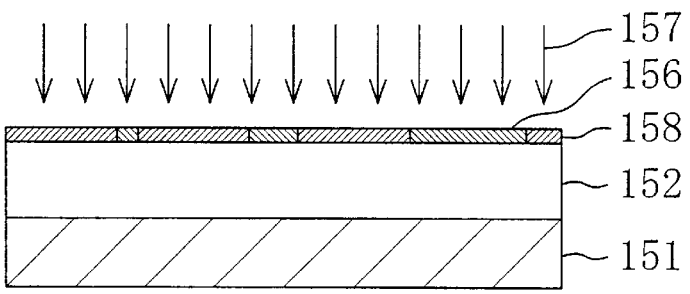
Figure 14D:
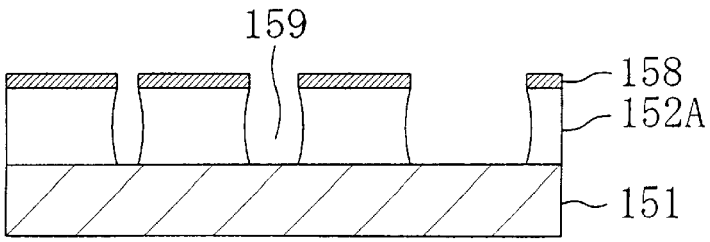
Figure 15A:
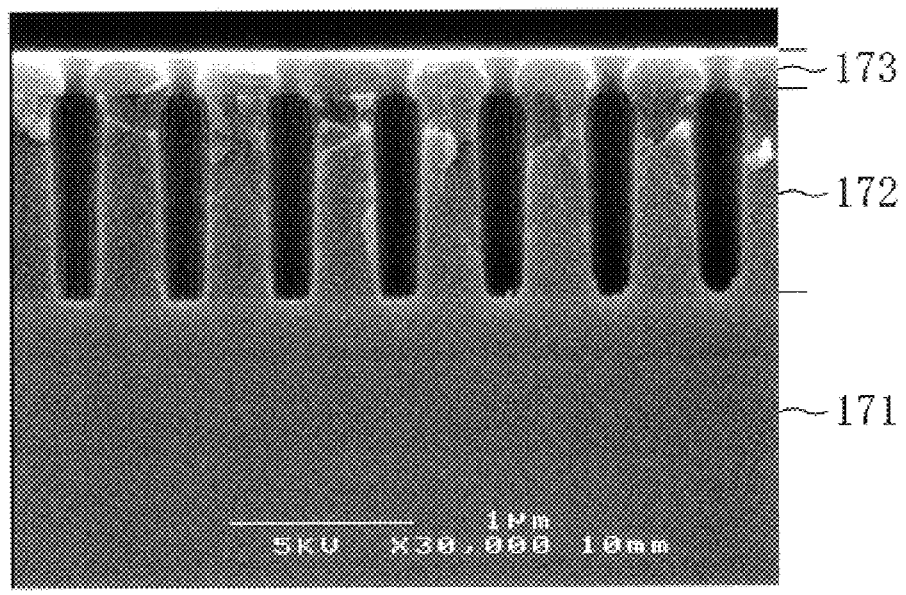
FIGS. 15A and 15B are cross-sectional SEM photographs of holes formed by a conventional mask pattern formation method (three-layer resist process).
Figure 15B:
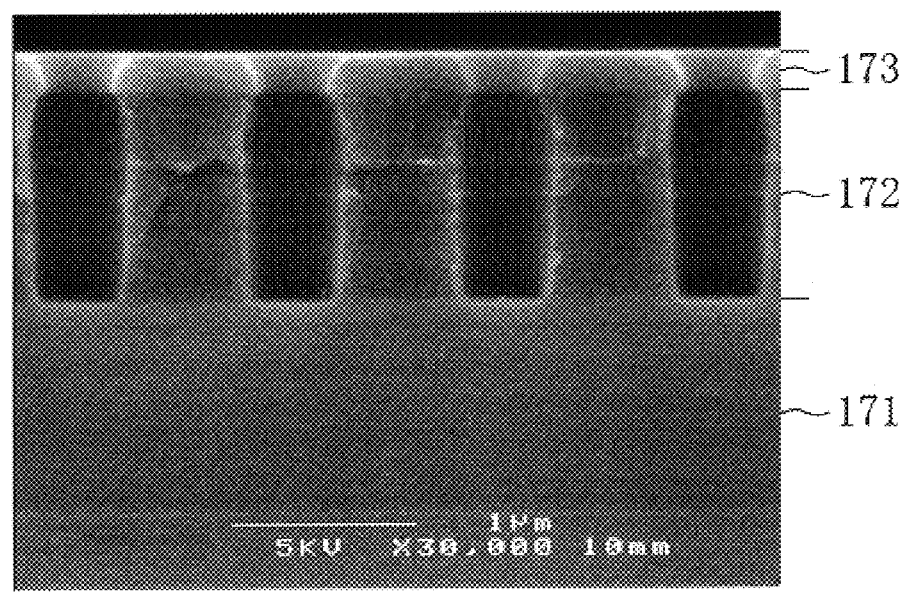

Owing to these two phenomena, the crown-shaped barrier wall 143 (shown in FIG. 13C) corresponding to the problem of Conventional Example 3 is never formed.

Figure 6A:
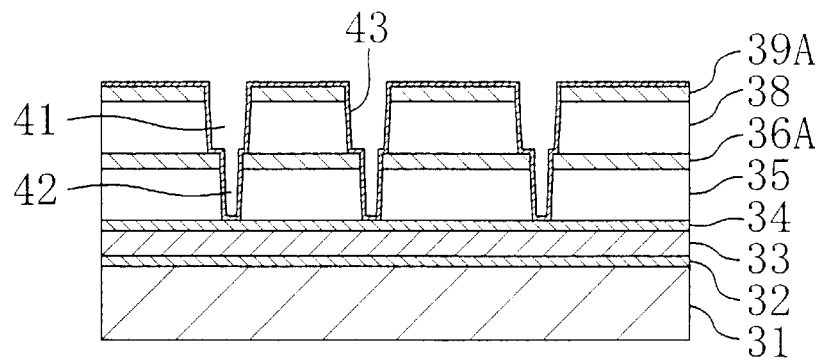
FIGS. 6A, 6B and 6C are cross-sectional views for showing other procedures in the method for fabricating a semiconductor device of Embodiment 3.

Next, after cleaning the inside of the via hole 42 and the interconnect groove 41 and the top face of the second mask pattern 39A, a third barrier metal layer 43 of TiN or TaN with a small thickness is formed on the walls of the via hole 42 and the interconnect groove 41 by the sputtering or the CVD as is shown in FIG. 6A. In this case, since each of the via hole 42 and the interconnect groove 41 has the forward taper cross-section, the third barrier metal layer 43 can be uniformly continuously formed without having a separated portion (disconnected portion).

Figure 6B:
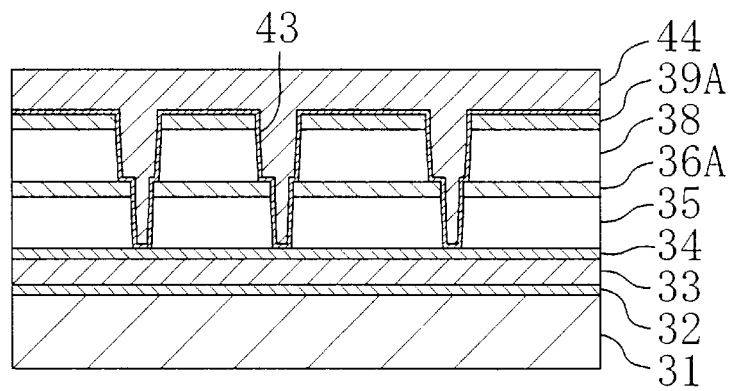
Figure 6C:
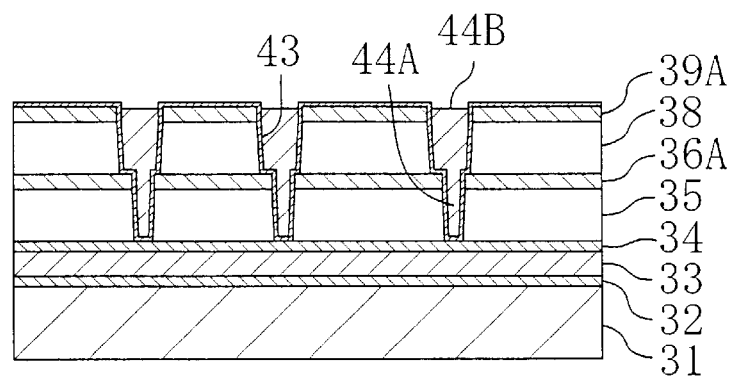

Then, as is shown in FIG. 6B, the via hole 42 and the interconnect groove 41 are filled with a conducting film 44 by the chemical vapor deposition or plating, and thereafter, a portion of the conducting film 44 exposed outside the interconnect groove 41 is removed by the chemical mechanical polishing. In this manner, a connection plug 44A and an upper interconnect 44B are formed from the conducting film 44.

Since each of the via hole 42 and the interconnect groove 41 has the vertical or forward taper cross-section in Embodiment 3, the third barrier metal layer 43 can be uniformly and continuously formed. Therefore, the conducting film 44 can be uniformly filled, resulting in obtaining good connection plug 44A and upper interconnect 44B. Also, since no crown-shaped barrier wall is formed on the bottom of the via hole 42, good connection can be obtained between the connection plug 44A and the lower interconnect.

Accordingly, a multi-level interconnect structure with high reliability can be formed by the dual damascene method according to Embodiment 3.

In Embodiment 3, the conducting film 33 for forming the lower interconnect and the conducting film 44 for forming the upper interconnect are made from, for example, a polysilicon film, a W film, an AlCu film, a Cu film, an Ag film, an Au film or a Pt film.

Also, the materials for the first barrier metal layer 32, the second barrier metal layer 34 and the third barrier metal layer 43 can be selected so as to accord with the conducting films 33 and 44. For example, each barrier film may be formed from a laminated film of a Ti film and a TiN film or a Ta film and a TaN film.

Moreover, an insulating film of $Si_3N_4$ or the like may be used as a barrier layer instead of the second barrier metal layer 34. In this case, after conducting the etching of the organic film for forming the via hole 42, the $Si_3N_4$ film is additionally etched.

Although the first mask pattern 36A and the second mask pattern 39A are formed from the silicon oxide films in Embodiment 3, a silicon nitride film may be used instead, whereas the material for the silicon nitride film preferably has a smaller dielectric constant than the silicon oxide film. Form this point of view, a material with a small dielectric constant, such as a-SiC:H, is preferably used.

In the case where the second mask pattern 39A is also removed in removing the conducting film 44 by the chemical mechanical polishing, the second mask pattern 39A may be formed from a material with a large dielectric constant, such as a conducting film of titanium or the like, a silicon nitride film, or a metal nitride film of titanium nitride or the like.

Embodiment 4

A mask pattern formation method according to Embodiment 4 of the invention (top surface imaging process) will now be described with reference to FIGS. 7A through 7D.

Figure 7A:
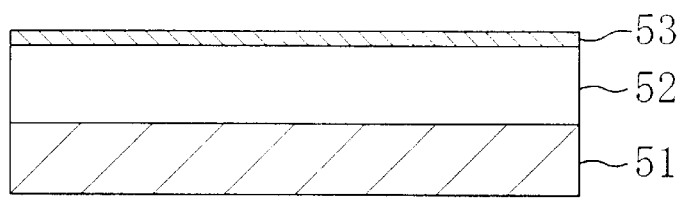
FIGS. 7A, 7B, 7C and 7D are cross-sectional views for showing procedures in a mask pattern formation method according to Embodiment 4 of the invention.

First, as is shown in FIG. 7A, an organic film 52 is formed on a semiconductor substrate 51, and then a silylation target layer 53 is formed on the organic film 52.

Figure 7B:
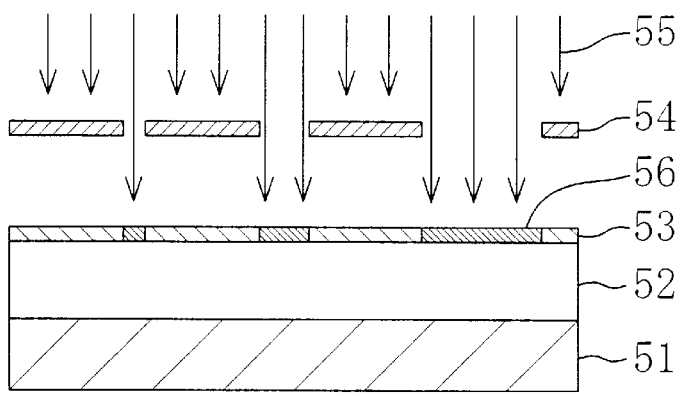

Next, as is shown in FIG. 7B, the silylation target layer 53 is irradiated with exposing light 55 through a photomask 54 for selectively allowing the light to pass, thereby selectively forming a decomposed layer 56 in the silylation target layer 53.

Figure 7C:
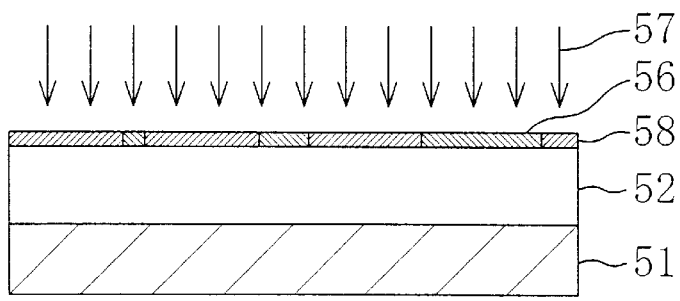

Then, as is shown in FIG. 7C, with the substrate temperature increased, a gaseous silylation reagent 57 is supplied onto the surface of the silylation target layer 53, thereby selectively silylating a non-decomposed portion (a portion excluding the decomposed layer 56) of the silylation target layer 53. Thus, a silylated layer 58 is formed.

Instead of silylating the non-decomposed portion, the decomposed layer 56 may be silylated to form the silylated layer 58, or the silylated layer 58 may be directly formed on the organic film 52 without forming the silylation target layer 53.

Figure 7D:
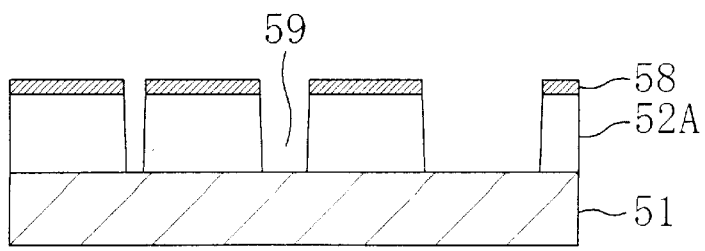
Figure 9A:
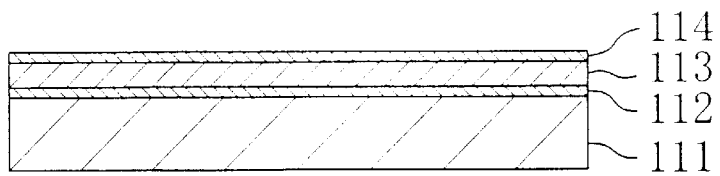
FIGS. 9A, 9B, 9C, 9D and 9E are cross-sectional views for showing procedures in a conventional method for fabricating a semiconductor device (single damascene method)
Figure 9B:
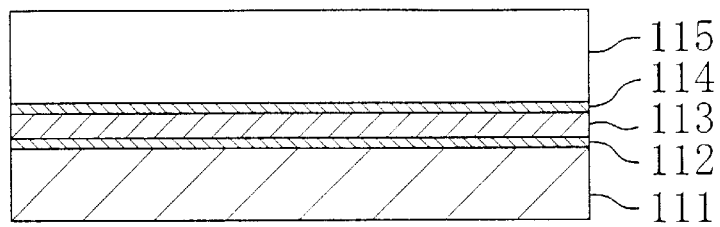
Figure 9C:
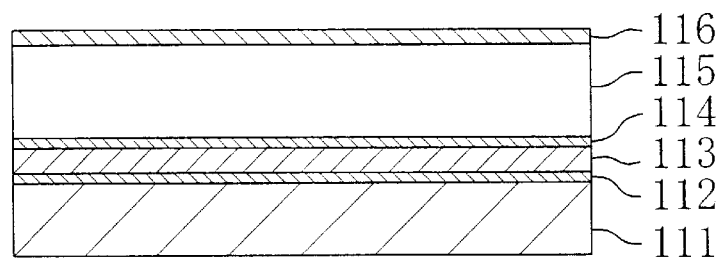
Figure 9D:
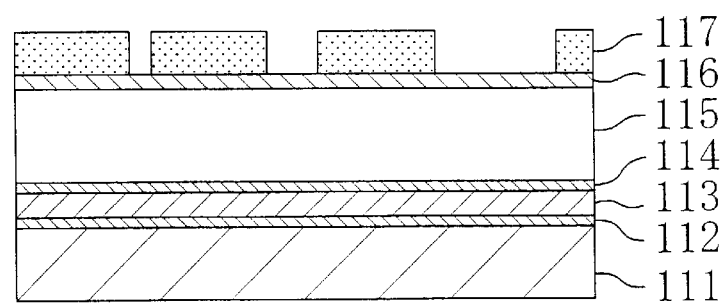
Figure 9E:
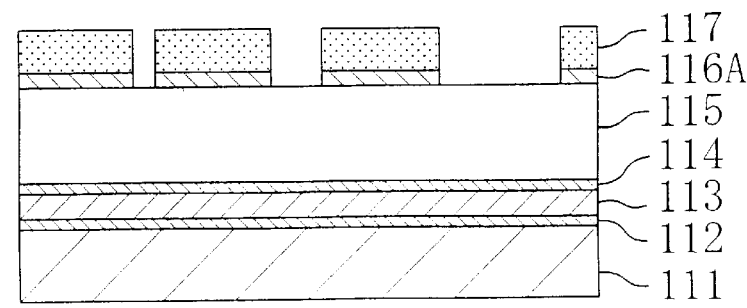
Figure 10A:
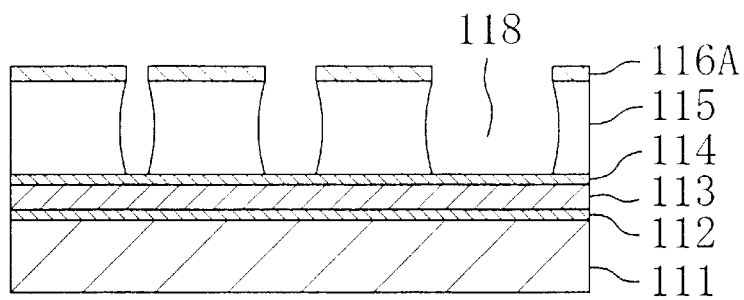
FIGS. 10A, 10B, 10C and 10D are cross-sectional views for showing other procedures in the conventional method for fabricating a semiconductor device (single damascene method)
Figure 10B:
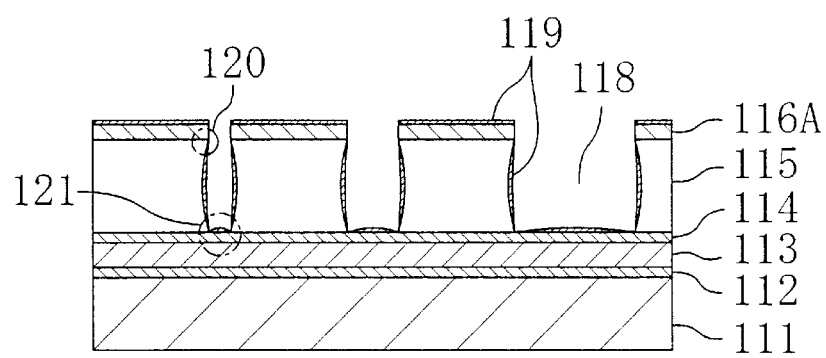
Figure 10C:
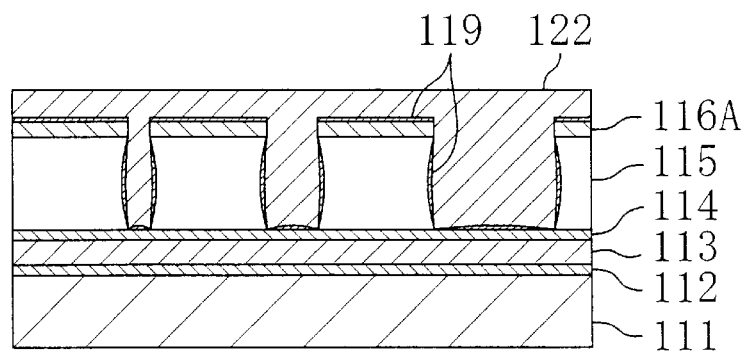
Figure 10D:
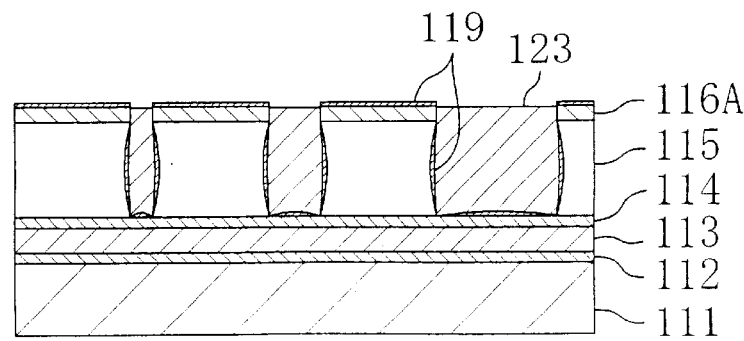
Figure 11A:
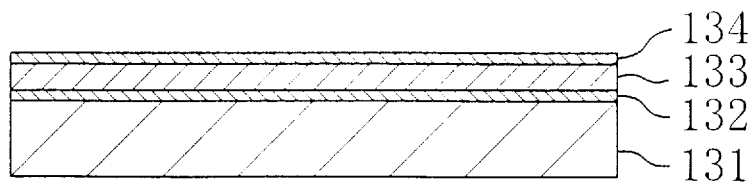
FIGS. 11A, 11B, 11C and 11D are cross-sectional views for showing procedures in a conventional method for fabricating a semiconductor device (dual damascene method)
Figure 11B:
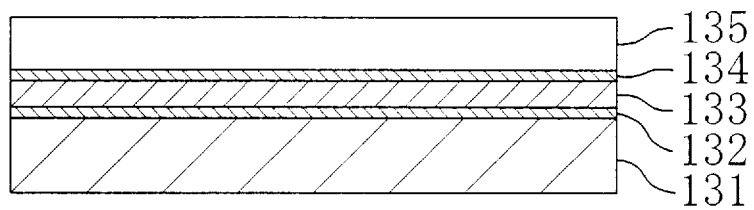
Figure 11C:
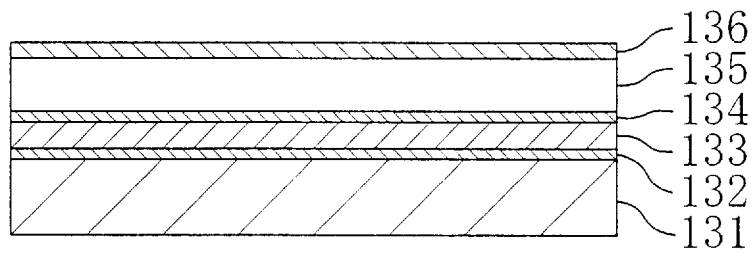
Figure 11D:
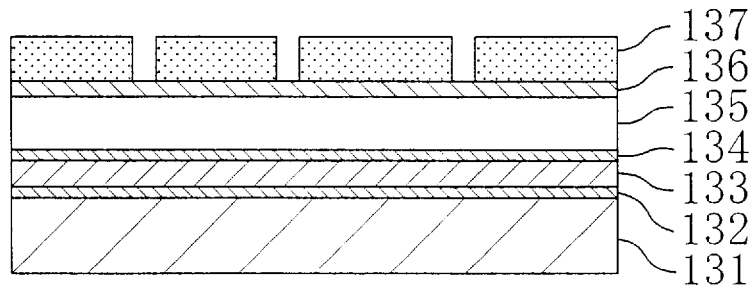
Figure 12A:
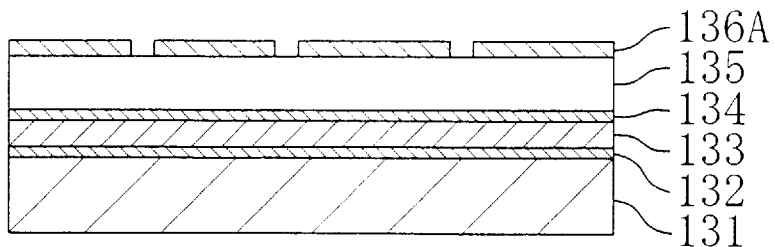
FIGS. 12A, 12B and 12C are cross-sectional views for showing other procedures in the conventional method for fabricating a semiconductor device (dual damascene method)
Figure 12B:
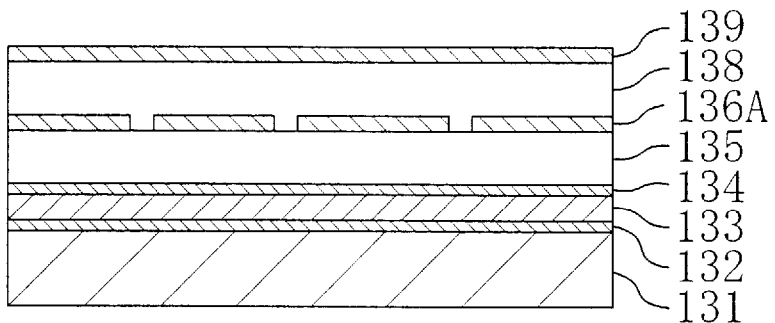
Figure 12C:
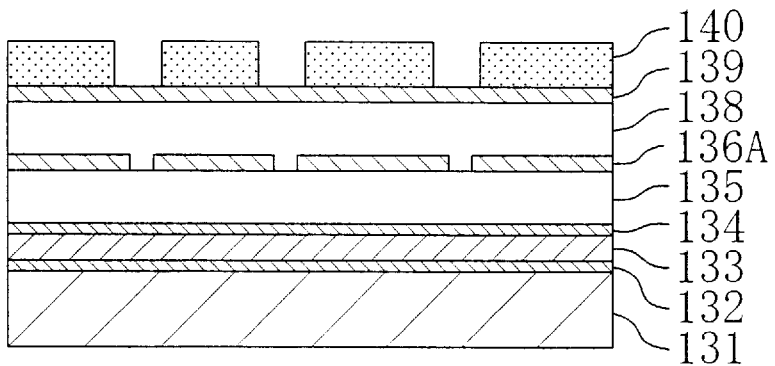

Next, by using the silylated layer 58 as a mask, the organic film 52 is etched by using plasma generated from an etching gas mainly including a gas of a compound including carbon, hydrogen and nitrogen in the same manner as in Embodiment 1. In this manner, an organic film pattern 52A is formed from the organic film 52 as is shown in FIG. 7D.

Since the organic film 52 is subjected to the plasma etching by using the etching gas mainly including the gas of the compound including carbon, hydrogen and nitrogen in Embodiment 4, a recess 59 formed in the organic film pattern 52A has a vertical or forward taper cross-section. Specifically, the recess 59 is prevented from having a cross-section in a bowing shape as in Conventional Example 4 and the organic film pattern 52A with a good cross-sectional shape can be obtained. Accordingly, an etch target film formed on the semiconductor substrate 51 can be precisely etched.

Also, since there is no need to add a deposition gas to the etching gas in Embodiment 4, RIE lag can be minimized. Therefore, even when a fine pattern is to be formed, a process margin such as allowance in etching amount can be sufficiently kept, and time for over-etching can be reduced to reduce a dimensional difference in transferring a pattern. As a result, a fine pattern can be precisely formed.

Although a silicon substrate is used as the semiconductor substrate 51 in Embodiment 4, the substrate may be a glass substrate used in a liquid crystal display panel or the like or a substrate of a compound semiconductor instead.

What is claimed is:

1. A method for etching an organic film comprising a step of etching an organic film to be used as an interlayer insulating film by using plasma generated from an etching gas containing, as a principal constituent, a compound including carbon, hydrogen and nitrogen.

2. The method for etching an organic film of claim 1,
wherein said compound is methylamine, dimethylamine, trimethylamine, ethylamine or propylamine.

3. A method for fabricating a semiconductor device comprising the steps of:

forming an organic film on a semiconductor substrate;

forming a mask pattern, on said organic film, including an inorganic compound as a principal constituent; and forming a recess in said organic film by selectively etching said organic film by using said mask pattern and by using plasma generated from an etching gas containing, as a principal constituent, a compound including carbon, hydrogen and nitrogen.

4. The method for fabricating a semiconductor device of claim 3,
wherein said compound is methylamine, dimethylamine, trimethylamine, ethylamine or propylamine.

5. The method for fabricating a semiconductor device of claim 3,
wherein said recess includes a via hole and an interconnect groove formed above said via hole and is filled with a metal material film by a dual damascene method.

6. A pattern formation method comprising the steps of:

forming an organic film on a substrate;

forming, on said organic film, a mask layer including an inorganic component; and forming an organic film pattern from said organic film by selectively etching said organic film by using said mask layer and by using plasma generated from an etching gas containing, as a principal constituent, a compound including carbon, hydrogen and nitrogen.

7. The pattern formation method for claim 6,
wherein said compound is methylamine, dimethylamine, trimethylamine, ethylamine or propylamine.

8. The pattern formation method for claim 6,
wherein said mask layer is a silylated layer.

* * * * *